United States Patent
Elwan et al.

(10) Patent No.: US 7,352,238 B2
(45) Date of Patent: Apr. 1, 2008

(54) DB-LINEAR ANALOG VARIABLE GAIN AMPLIFIER (VGA) REALIZATION SYSTEM AND METHOD

(75) Inventors: Hassan Elwan, Lake Forest, CA (US); Amr Fahim, Newport Beach, CA (US); Aly Ismail, Irvine, CA (US); Edward Youssoufian, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 99 days.

(21) Appl. No.: 11/472,138

(22) Filed: Jun. 21, 2006

(65) Prior Publication Data

US 2007/0296490 A1 Dec. 27, 2007

(51) Int. Cl.
*H03F 1/36* (2006.01)
(52) U.S. Cl. ......................................... 330/86; 330/144
(58) Field of Classification Search ................. 330/144
See application file for complete search history.

(56) References Cited

U.S. PATENT DOCUMENTS

| | | | |
|---|---|---|---|
| 5,245,229 A * | 9/1993 | Colvin, Sr. .................. | 327/361 |
| 5,877,612 A * | 3/1999 | Straw ......................... | 330/254 |
| 6,127,893 A * | 10/2000 | Llewellyn et al. .......... | 330/284 |
| 6,825,718 B2 * | 11/2004 | Kang et al. .................. | 330/86 |

OTHER PUBLICATIONS

Harjani, R., "Low-Power CMOS VGA for 50 Mb/s Disk Drive Read Channels," IEEE Trans. Circuits Syst. II, vol. 42, pp. 370-376, Jun. 1995.
Motamed, A., et al., "A Low-Voltage Low-Power Wide-Range CMOS Variable Gain Amplifier," IEEE Transactions on Circuits and Systems—II: Analog and Digital Signal Processing, vol. 45, No. 7, pp. 800-811, Jul. 1998.

\* cited by examiner

*Primary Examiner*—Robert J. Pascal
*Assistant Examiner*—Alan Wong
(74) *Attorney, Agent, or Firm*—Mohammad S. Rahman, Esq.; Gibb & Rahman, LLC

(57) ABSTRACT

A dB-linear variable gain amplifier, a method for creation, and a system includes an amplifier; a pair of resistor arrays operatively connected to the amplifier, wherein each resistor array comprises MOS transistor resistive switches; a differential ramp-generator circuit operatively connected to the pair of resistor arrays; and voltage control lines generated by the differential ramp-generator circuit, wherein the voltage control lines are operatively connected to each of the MOS transistor resistive switches in the pair of resistor arrays. The number of the voltage control lines that are operatively connected to the each of the MOS transistor resistive switches is equal to the number of resistors in a particular resistor array. The differential ramp-generator circuit is preferably operable to take an automatic gain control voltage and generate a series of differential ramp voltages and apply the series of differential ramp voltages to one of the MOS transistor resistive switches.

24 Claims, 14 Drawing Sheets

MOS switches $R_{offset}$ realization
[ $d_0 \rightarrow d_n$ ] digital offset word

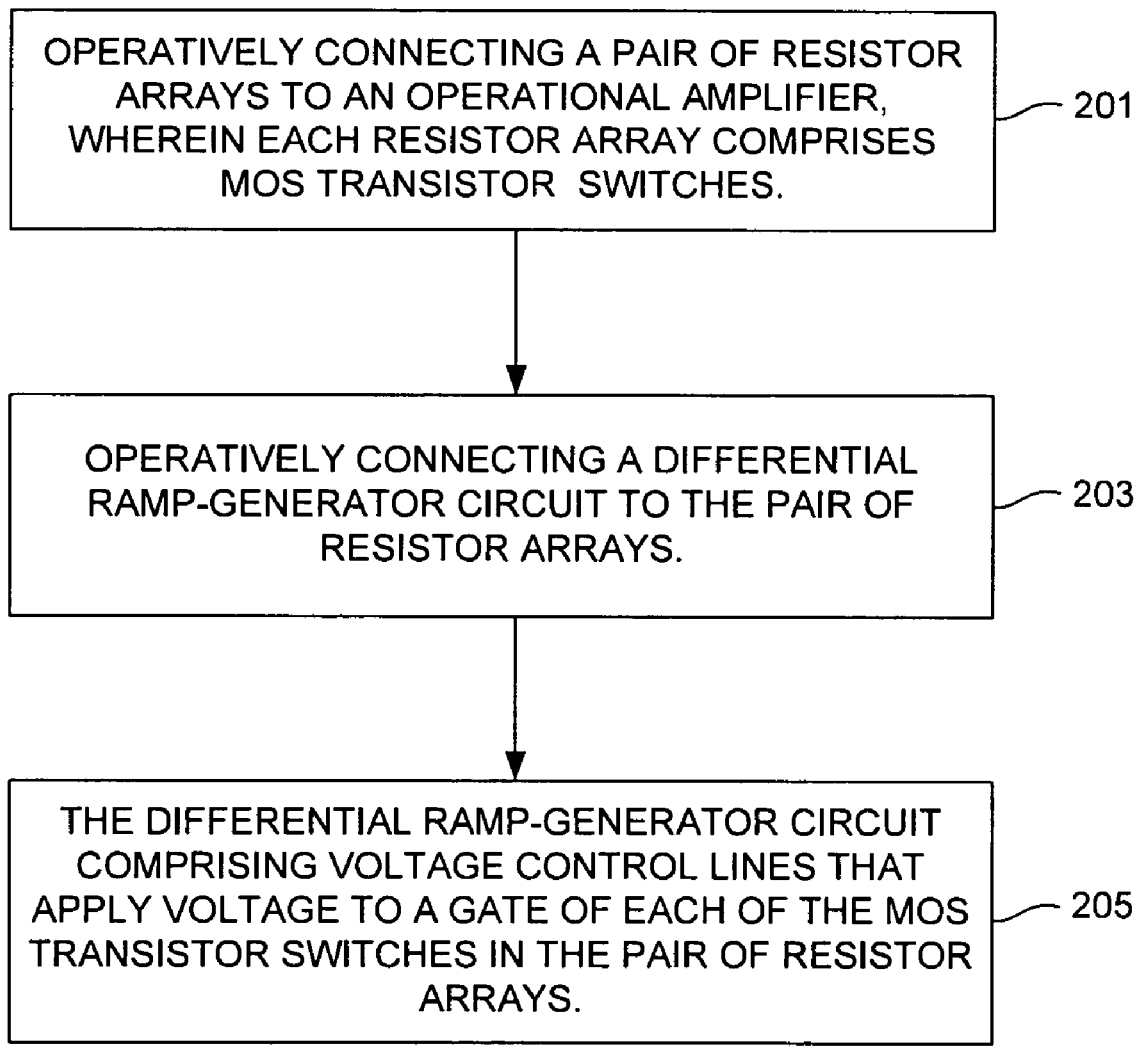

DB-LINEAR ANALOG VARIABLE GAIN AMPLIFIER (VGA) REALIZATION SYSTEM AND METHOD

BACKGROUND

1. Technical Field

The embodiments herein generally relate to electrical circuits, and, more particularly, to techniques for implementing an analog variable gain amplifier (VGA) to enhance overall system signal processing.

2. Description of the Related Art

To realize a dB-linear VGA circuit in a non-bipolar junction transistor (BJT) technology, the exponential automatic gain control (AGC) characteristics is approximated by Equation (1): $e^x=(1+x)/(1-x)$. One method to realize the VGA is shown in FIG. 1. The AGC control voltage is applied to an exponential converter circuit that converts the AGC control voltage according to the previous expression (or other approximations). The output voltage of this circuit is then fed into a control port of a multiplier. The signal is then applied to the input port of the multiplier circuit. The multiplier circuit will linearly multiply the input signal with the signal applied to the control port. Hence, the dB-Linear VGA is realized.

Another method to realize the VGA is shown in FIG. 2. The circuit shows two cascaded transconductor stages. The gain of such a configuration is the ratio of transconductances, Equation (2), $A=gm_1/gm_2$. If an electronically tuned gm stage is used, then the dB-linear gain can be realized by increasing the tuning signal of $gm_1$ (the controlling signal can be a voltage $Vc_1$ or a biasing current $Ib_1$) while simultaneously reducing the $gm_2$ tuning signal (can be a voltage $Vc_2$ or a current $Ib_2$). This directly implements a gain that changes exponentially with the AGC control voltage.

Unfortunately, the methods of FIGS. 1 and 2 generally suffer from, first, limited signal headroom. This is mainly caused by the difficulty of realizing multipliers or tunable gm stages with rail-to-rail swing. Furthermore, as integrated circuits (ICs) continue to migrate towards deep sub-micron technologies, the allowed supply voltage is becoming more limited and maintaining wider signal headroom is seen as being crucial for maintaining good dynamic range and lower power consumption.

Second, the methods of FIGS. 1 and 2 tend to suffer from noise performance. In the first method (FIG. 1), the noise of the exponential converter circuit is amplitude modulated by the input signal. Hence, the exponential converter circuit has a significant contribution to the total noise of the VGA. Furthermore, the realization of a linear multiplier circuit involves the use of many active devices in the signal path. The noise and non-ideality of those devices generally leads to poor noise performance (as compared to op-amp based circuits).

Third, the methods of FIGS. 1 and 2 tend to suffer from limited VGA linearity. This is because realizing linear multipliers or tunable gm-transconductors is achieved through circuit techniques that linearize the characteristics of the active devices used. Such techniques are sensitive to device non-idealities as well component mismatches. Generally, this results in signal distortion that limits the overall dynamic range of the VGA.

Fourth, the methods of FIGS. 1 and 2 tend to suffer from VGA gain mismatches. Both conventional methods rely on transistors' tranconductance in achieving the VGA function. Hence, in applications where the use of matched VGAs is required, VGA circuits realized using these conventional methods will generally be harder to use (statistically, a larger percentage of components will exhibit non-acceptable mismatches).

Fifth, with respect to the methods of FIGS. 1 and 2, in most cases, the output of the transconductor as well as the multiplier is un-buffered. Hence, the VGA typically cannot drive a load resistance directly. Accordingly, an extra buffer stage is necessary to achieve this.

In conclusion, the conventional methods, as illustrated in FIGS. 1 and 2, offer clear disadvantages relating to: (1) limited signal swing; (2) higher noise that limits the minimum signal that the VGA circuits can process; (3) degraded over-all linearity that results in signal distortion, especially at higher signal levels; (4) difficulty in achieving sufficiently good matching between similar VGA circuits; and (5) in most cases, the outputs of the transconductor as well as the multiplier is un-buffered. Hence, the VGA cannot drive a load resistance directly, whereby an extra buffer stage is necessary to achieve this. In view of the drawbacks and limitations of the conventional techniques, there remains a need for a new technique for realizing dB-linear VGAs.

SUMMARY

In view of the foregoing, an embodiment herein provides a method for creating a dB-linear VGA, wherein the method comprises operatively connecting a pair of resistor arrays to an operational amplifier, wherein each resistor array comprises metal oxide semiconductor (MOS) transistor switches; operatively connecting a differential ramp-generator circuit to the pair of resistor arrays; and the differential ramp-generator circuit comprising voltage control lines that apply voltage to a gate of each of the MOS transistor switches in the pair of resistor arrays. Preferably, the number of the voltage control lines that are used to apply voltage to the gate of each of the MOS transistor switches is equal to the number of resistors in a particular resistor array. The method may further comprise the differential ramp-generator circuit taking an automatic gain control voltage, generating a series of differential ramp voltages, and applying the series of differential ramp voltages to one of the MOS transistor switches.

The conductance on a first of the pair of resistor arrays may linearly and continuously increases while simultaneously the conductance on a second of the pair of resistor arrays linearly and continuously decreases as the automatic gain control voltage increases. Moreover, the method may further comprise operatively connecting a voltage source device in series with a virtual ground terminal of the operational amplifier. Furthermore, the operational amplifier preferably comprises a capacitance array operable to be gradually switched using the MOS transistor switches and ramp-generator signals generated by the differential ramp-generator circuit. Additionally, the method may further comprise using an automatic gain control loop filter to control the automatic gain control voltage. Also, the method may further comprise the differential ramp-generator circuit taking an automatic gain control voltage, generating a series of differential ramp voltages, and applying the series of differential ramp voltages to multiple operational amplifiers.

Another aspect of the embodiments herein provide a variable gain amplifier comprising an amplifier; a pair of resistor arrays operatively connected to the amplifier, wherein each resistor array comprises MOS transistor resistive switches; a differential ramp-generator circuit operatively connected to the pair of resistor arrays; and voltage control lines generated by the differential ramp-generator circuit, wherein the voltage control lines are operatively connected to each of the MOS transistor resistive switches in the pair of resistor arrays. Preferably, the number of the voltage control lines that are operatively connected to the each of the MOS transistor resistive switches is equal to the number of resistors in a particular resistor array. Moreover, the differential ramp-generator circuit is preferably operable to take an automatic gain control voltage and generate a series of differential ramp voltages and apply the series of differential ramp voltages to one of the MOS transistor resistive switches. Additionally, the conductance on a first of the pair of resistor arrays preferably linearly and continuously increases while simultaneously the conductance on a second of the pair of resistor arrays linearly and continuously decreases as the automatic gain control voltage increases.

The variable gain amplifier may further comprise a voltage source device operatively connected in series with a virtual ground terminal of the amplifier. Furthermore, the amplifier may comprise a capacitance array operable to be gradually switched using the MOS transistor resistive switches and ramp-generator signals generated by the differential ramp-generator circuit. Also, the variable gain amplifier may further comprise an automatic gain control loop filter operable to control the automatic gain control voltage. Moreover, the differential ramp-generator circuit may be operable to take an automatic gain control voltage and generate a series of differential ramp voltages and apply the series of differential ramp voltages to multiple operational amplifiers.

Another aspect of the embodiments herein provides a system comprising an operational amplifier; at least one set of resistor arrays operatively connected to the operational amplifier, wherein each resistor array comprises MOS transistor switches; and a differential ramp-generator circuit operatively connected to the at least one set of resistor arrays, wherein the differential ramp-generator circuit is operable to generate voltage control lines that apply voltage to a gate of each of the MOS transistor switches in the at least one set of resistor arrays. Preferably, the number of the voltage control lines that are used to apply voltage to the gate of each of the MOS transistor switches is equal to the number of resistors in a particular resistor array. Moreover, the differential ramp-generator circuit is preferably operable to take an automatic gain control voltage and generate a series of differential ramp voltages and apply the series of differential ramp voltages to one of the MOS transistor switches.

Preferably, the conductance on a first of the at least one set of resistor arrays linearly and continuously increases while simultaneously the conductance on a second of the at least one set of resistor arrays linearly and continuously decreases as the automatic gain control voltage increases. Additionally, the system may further comprise a voltage source device operatively connected in series with a virtual ground terminal of the operational amplifier. Furthermore, the operational amplifier may comprise a capacitance array operable to be gradually switched using the MOS transistor switches and ramp-generator signals generated by the differential ramp-generator circuit. The system may further comprise an automatic gain control loop filter operable to control the automatic gain control voltage. Also, the differential ramp-generator circuit may be operable to take an automatic gain control voltage and generate a series of differential ramp voltages and apply the series of differential ramp voltages to multiple operational amplifiers.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 11 is a flow diagram illustrating a preferred method according to an embodiment herein.

DETAILED DESCRIPTION OF PREFERRED EMBODIMENTS

Figure 1:
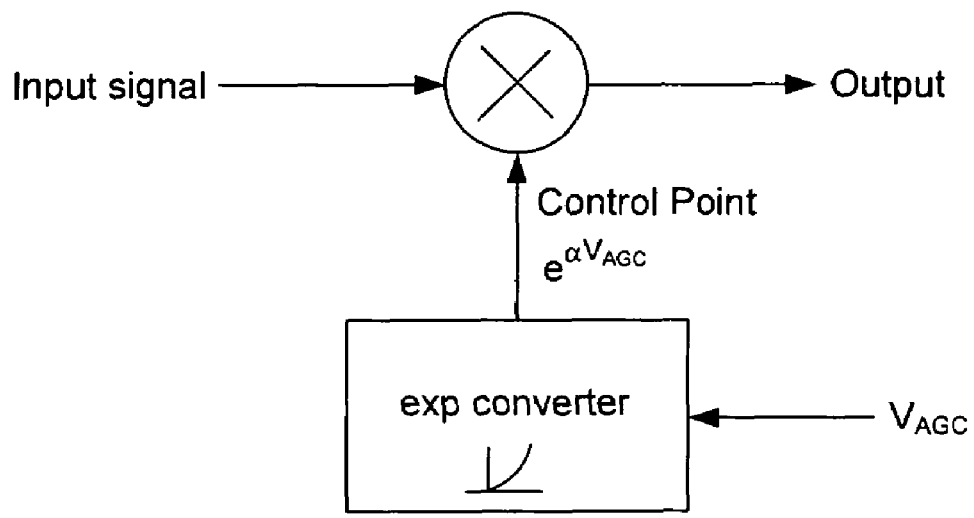
FIGS. 1 and 2 are schematic diagrams illustrating conventional circuits for VGA realization.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a new technique for realizing dB-linear VGAs. The embodiments herein achieve this by providing a system and method for dB-linear analog VGA realization with rail-to-rail input and output swings, low noise, and high linearity. Referring now to the drawings, and more particularly to FIGS. 3 through 8(B) and 8(D) through 11, where similar reference characters denote corresponding features consistently throughout the figures, there are shown preferred embodiments.

The embodiments herein provide a new technique to realize dB-linear variable gain amplifiers. Using this technique VGA circuits that exhibit rail to rail input and output swing can be easily realized. This enhances the over all dynamic range of the VGA and allows the system to handle signals with wider swing. The technique also has a small impact on noise and linearity, hence VGA circuits employing this technique can also provide good linearity and noise performance. The versatility of this technique is shown by applying it to a standard over sampled ADC converter to provide a dB-linear VGA function within the modulator structure and hence increasing the overall dynamic range of the converter.

Figure 3A:
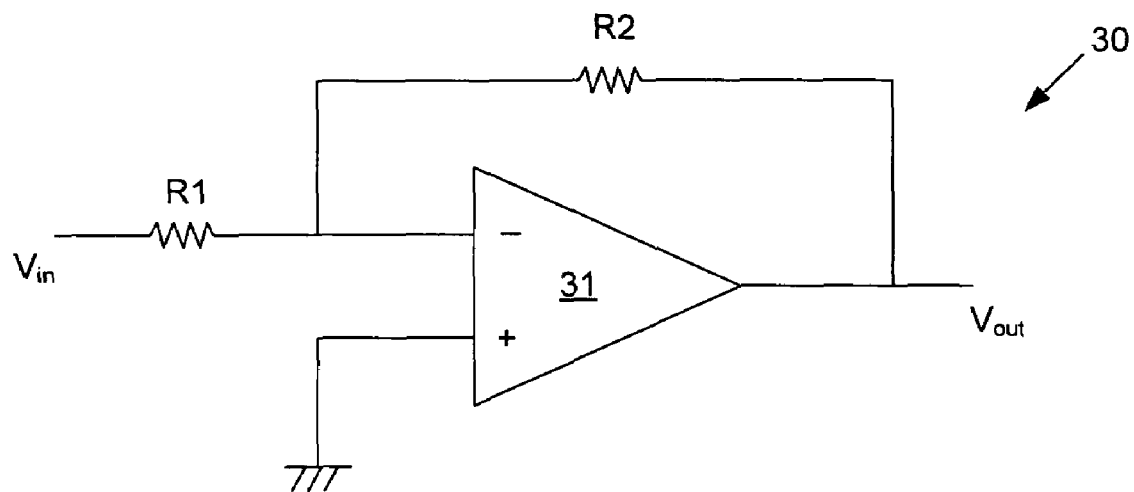
FIG. 3(A) is a schematic circuit diagram illustrating a gain stage for a single ended amplifier according to an embodiment herein.
Figure 3B:
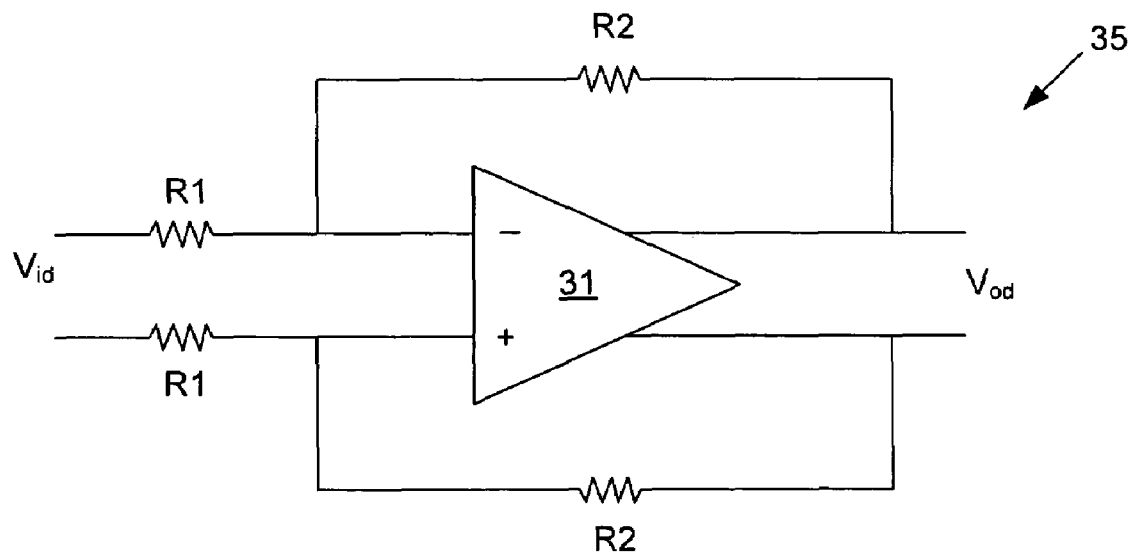
FIG. 3(B) is a schematic circuit diagram illustrating a gain stage for a fully differential amplifier according to an embodiment herein.

Consider the gain stage shown in FIGS. 3(A) and 3(B), where FIG. 3(A) depicts a single ended amplifier 30 and FIG. 3(B) depicts a fully differential amplifier 35. These amplifiers 30, 35 are based on an op-amp 31 operating in a negative feedback topology. Such a configuration is attractive because it can handle rail-to-rail input and output gain is stable over process and temperature. So long as the amplifier 30, 35 used has a sufficiently high DC gain and large unity gain frequency, the distortion of this stage can be kept low. To realize a dB-linear VGA, the resistor R2 should preferably be linearly increased while simultaneously equally reducing the resistance R1. This implements the function $(1+x)/(1-x)$. The resistance change should preferably be continuous and tuned by a voltage, $V_{agc}$, (the automatic gain control voltage). Furthermore, the circuits employed to realize the tuning of R1 and R2 should preferably not contribute much noise or distortion to the output of the VGA.

Figure 4A:
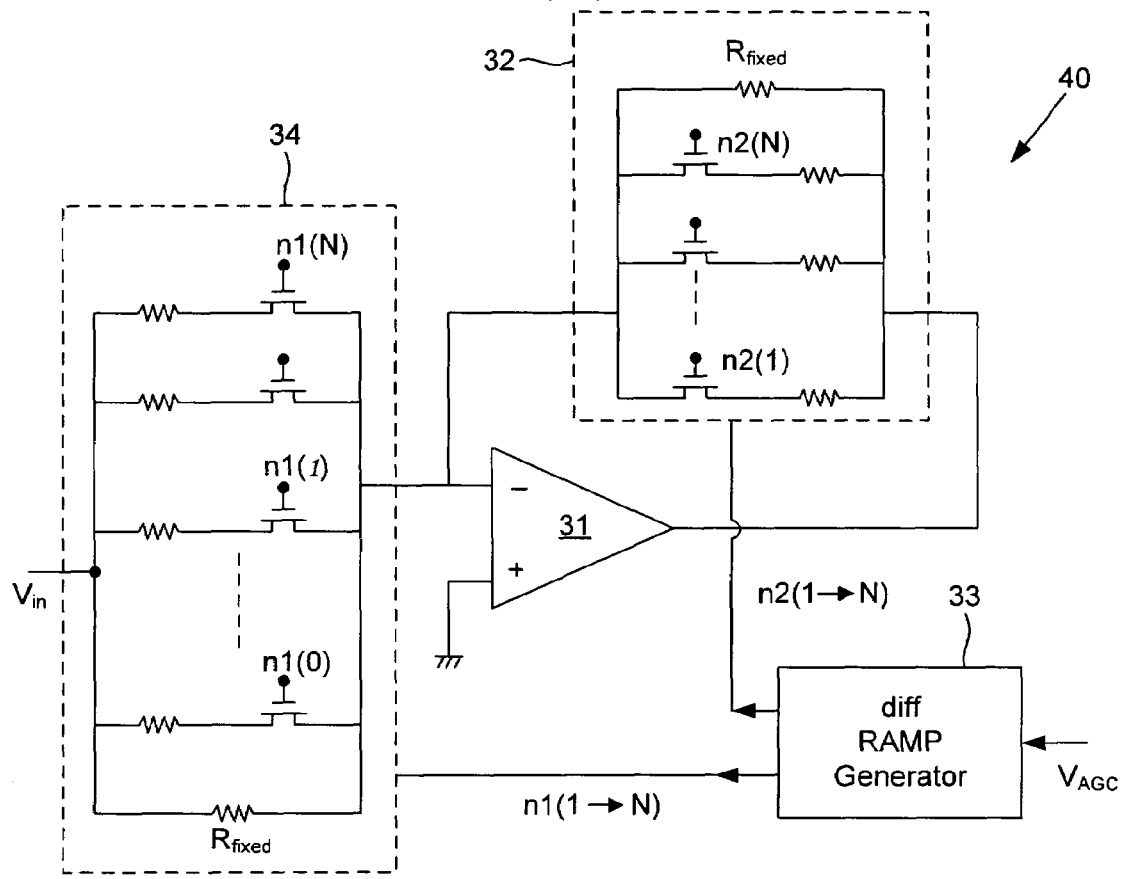
FIGS. 4(A) and 4(B) are schematic diagrams illustrating a circuit for VGA realization according to an embodiment herein.
Figure 4B:
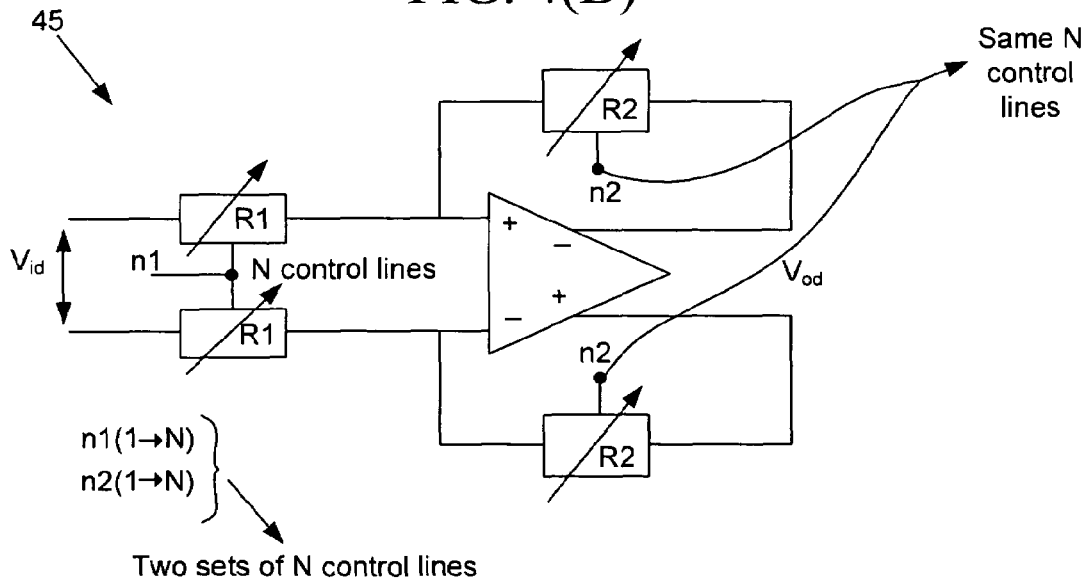
Figure 5A:
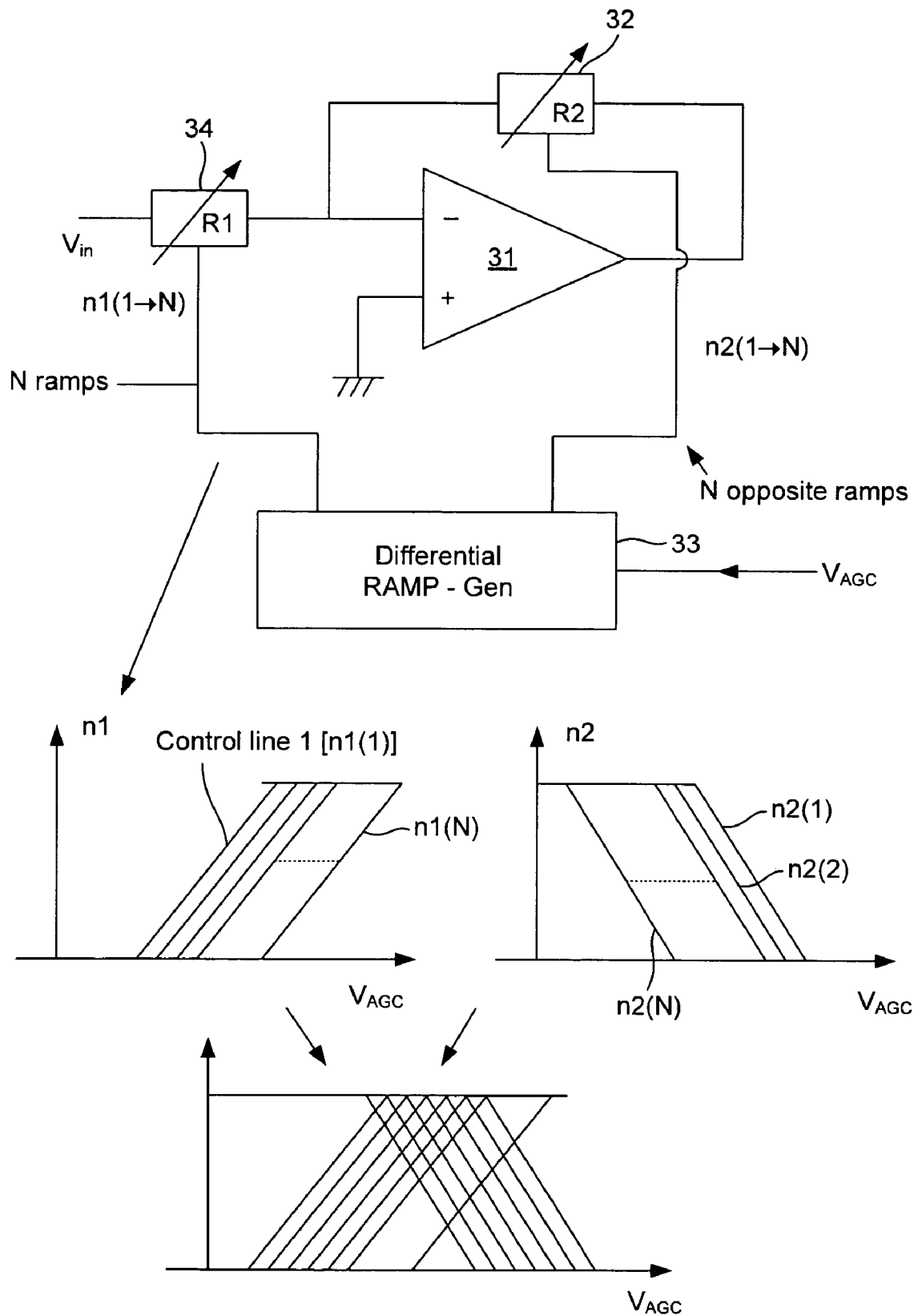
FIGS. 5(A) and 5(b) are schematic diagrams illustrating associated differential ramp voltages for a circuit for VGA realization according to an embodiment herein.
Figure 5B:
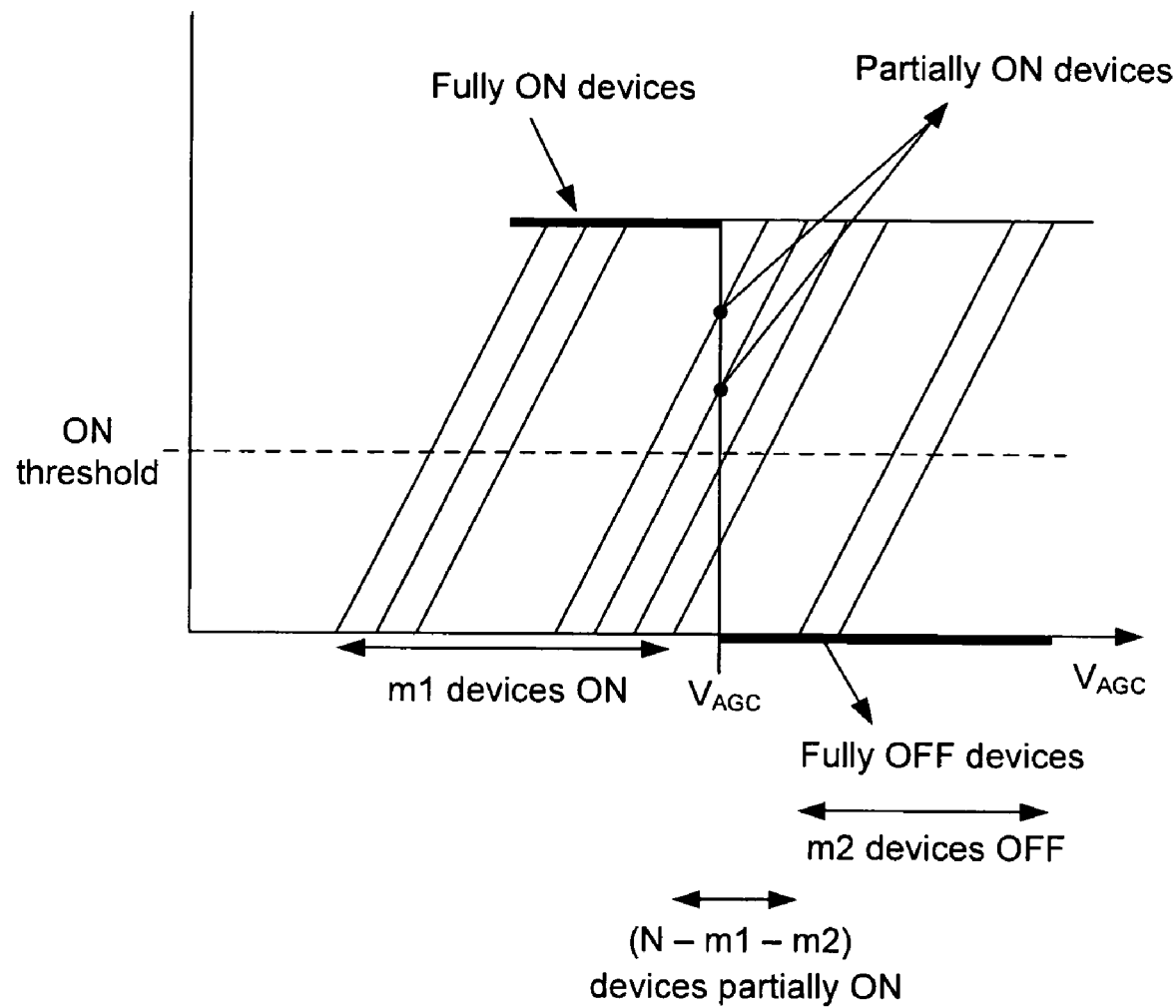
Figure 6A:
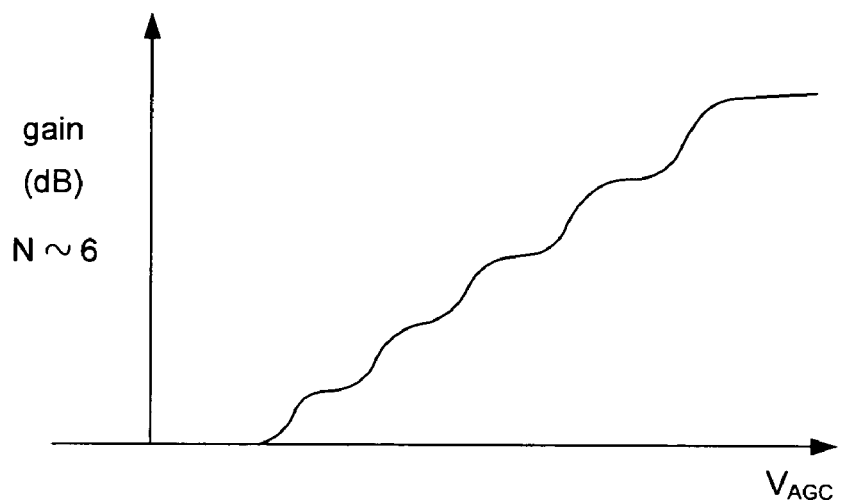
FIGS. 6(A) through 6(C) are graphical representations illustrating the gain of the VGA stage versus the VGA control voltage according to an embodiment herein.
Figure 6B:
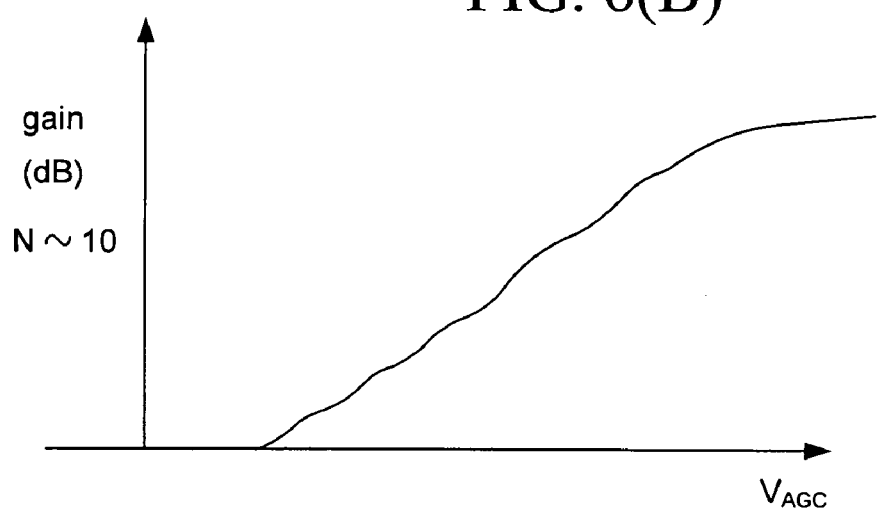
Figure 6C:
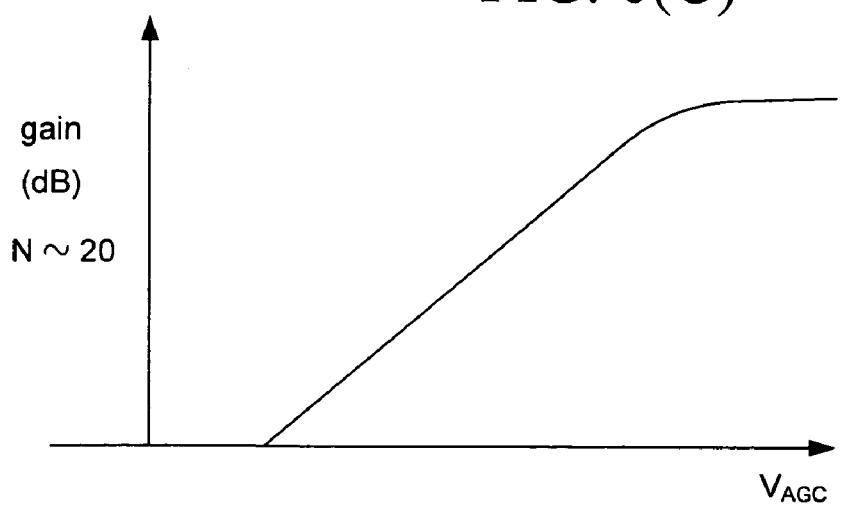

The method of implementation according to the embodiments herein is shown in FIGS. 4(A) and 4(B). In FIG. 4(A), resistance R1 and R2 are replaced by resistor arrays 34, 32, respectively, with MOS transistor resistive switches, ni. While only N-type field effect transistors (NFETs) are shown in the drawings, the embodiments herein may include NFETs, P-type field effect transistors (PFETs), transmission gates, or any other "linear" switching device in the resistor arrays. Assuming there are a total of N resistors in parallel, as illustrated in FIG. 4(B), there will be N control lines connected to the gates of the MOS resistive switch realizing the resistance R1 (n1). There will also be another set of N lines going to the gates of the MOS resistive switches realizing R2 (n2). A differential ramp-generator circuit 33 generates the control lines of R1 and R2. The ramp generator circuit 33 takes the AGC control voltage and generates a series of differential ramps as shown in FIGS. 5(A) and 5(B). Each ramp voltage is applied to the gate of one of the MOS resistive switches, ni, of FIG. 4(A). To illustrate the operation of the ramp-generator circuit 33 with the VGA assume the AGC control voltage ($V_{agc}$) is set to a point $V_{agc}$ as illustrated in FIGS. 6(A) through 6(C). At this point, there will be m MOS switches in R1 with a supply voltage applied to their gate. Those transistors have relatively larger gate to source voltages (hence are strongly ON) and will have a small ON resistance. In other words, the transistors act more like a switch. Hence, there will be m1 resistors in the R1 array that are connected in parallel with an effective conductance of $Ron(1)=m1*G$, where Rsw (fully on) <<R.

However, for the array realizing R2, the opposite set of control lines is applied. Hence, there will be m2 devices that are fully turned on. Additionally, there are a number of devices in both the R1 and R2 arrays 34, 32 that will be partially on since their gate voltages have a voltage between supply voltage and ground. The number of such devices is (N-m1-m2) and can be changed by adjusting the slope of the generated ramps as well as the spacing between them.

As the AGC control voltage is increased, more devices will start to gradually turn on; hence, increasing the effective number of devices turned on in the R1 array 34. Simultaneously, more devices will start to gradually turn off from the R1 array 34. This will equally reduce the effective number of devices that are on in the R2 array 32. If the number of parallel devices is adequate and the generated ramps are generated in such a way that the number of devices transitioning between the ON and OFF state (Nm-1-m2) is also adequate, the conductance of the R1 resistance array 34 will increase in a linearly continuous manner. Similarly, the overall conductance of the R2 array 32 will decrease in a linearly continuous manner.

The arrays 34, 32 realizing R1 and R2 has a fixed resistance, $R_{fixed}$, that is always ON. This resistance is chosen to be much larger than the resistors implementing the array 34, 32. The value of this resistance sets the maximum and minimum gain achieved by the VGA stage. Since the exponential approximation of e(x) given by Equation (1) holds well for approximately 24 dB to 28 dB, a good choice of $R_{fixed}$ is equal to $5*(R/N)$, where R is the resistance of one element of the resistance array and N is the total number of resistances used (same as the total number of control lines used). Hence, the effective gain of the VGA stage will realize the function $(1+x)/(1-x)$ where x is a linear function of the AGC control voltage $V_{agc}$. Again, FIGS. 6(A) through 6(C) show the gain of the VGA versus the AGC control voltage ($V_{agc}$). By increasing the number of passive elements used (N) a smoother characteristic can be obtained as shown in FIG. 6(C). A value of N between 15 and 25 usually provides sufficient results.

The technique provided by the embodiments herein offer superior noise and distortion performance. This is because at any given AGC control voltage, the fully ON devices will behave mostly like a passive resistance, and the MOS switch, ni, will have almost no impact on linearity and distortion, especially if the MOS device is placed at the virtual ground terminal of the op-amp 31. Similarly, the devices that are in the OFF state do not contribute any noise or linearity degradation. The only devices that can contribute to distortion and noise are the partially ON devices. For those devices, the MOS switch, ni, is actually operating as a resistance and the non-linearity and noise of the device will contribute to the total output noise. However, since at the VGA higher gain settings (where noise is important) those devices are in parallel with other ON devices, the over-all resistance tends to be dominated by the ON devices and the partially ON devices have very little contribution to any noise or linearity degradation. Furthermore, the MOS device is in series with a passive resistance which is highly linear. Thus, the distortion caused by the MOS device is even further reduced.

Since the MOS resistive switches are all placed near the virtual ground node of the op-amp 31, the turn-on voltage of those devices is well controlled (it is a threshold voltage above the virtual ground voltage) and is largely independent of the input and output voltage levels of the VGA. The VGA is thus able to handle rail-to-rail output and input signal levels with excellent linearity and noise performance.

It is also clear that the VGA gain is mainly determined by the ratio of the ON resistances of R2 and R1. Hence, the matching of two VGA circuits can be as good as the matching of the passive resistances employed. The active op-amp circuit 31 is in feedback topology, and as long as the unity gain frequency of the op-amp 31 is adequate as well as its open loop gain, mismatches in the op-amp devices 31 will have insignificant effects on the overall matching of the VGA circuits 40, 45. The differential ramp generator circuit 33 can also be shared by the two VGA circuits 40, 45.

Figure 7A:
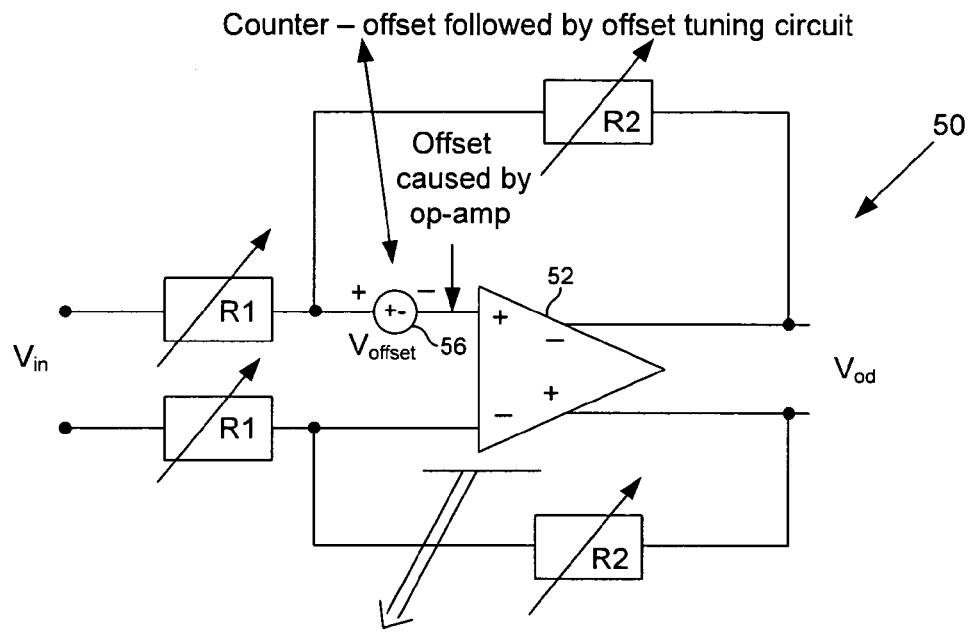
FIGS. 7(A) and 7(B) are schematic diagrams illustrating offset control for a circuit for VGA realization according to an embodiment herein.

The embodiments herein also provide offset control that is independent of the VGA gain setting. A simple way to realize an offset control that is independent on the gain setting for this VGA is shown in FIG. 7(A), which illustrates a two stage fully differential op-amp VGA topology 50 based on the embodiments herein. The offset in the VGA circuit 50 has two sources. The first source is the op-amp circuit 52 itself. Mismatches between the MOS devices (not shown) used in the op-amp 52 will cause a DC offset which can be effectively represented by a voltage source 56 at the input of one of the virtual ground nodes of the op-amp 52. This offset, will then be amplified by the gain of the VGA 50. The final offset at the output is thus (Equation (3)): $V_{offset\_output} = (R2/R1) * V_{offset\_opamp}$.

This value will change whenever the gain (R2/R1) changes. Hence, the VGA circuit 50 has an offset that is a function of the gain setting. This may not be desirable in some applications since it requires continuous offset calibration whenever the VGA gain is being changed. To realize a VGA circuit with a constant offset, consider the circuit 58 shown in FIG. 7(B). The circuit 58 employs an offset correction differential pair (G2) that is connected in parallel with the main op-amp diff pair (G1). The conductance of G2 is made much less than that of G1. This makes the noise contribution of the offset circuit negligible. It also allows for finer offset control.

Figure 7B:
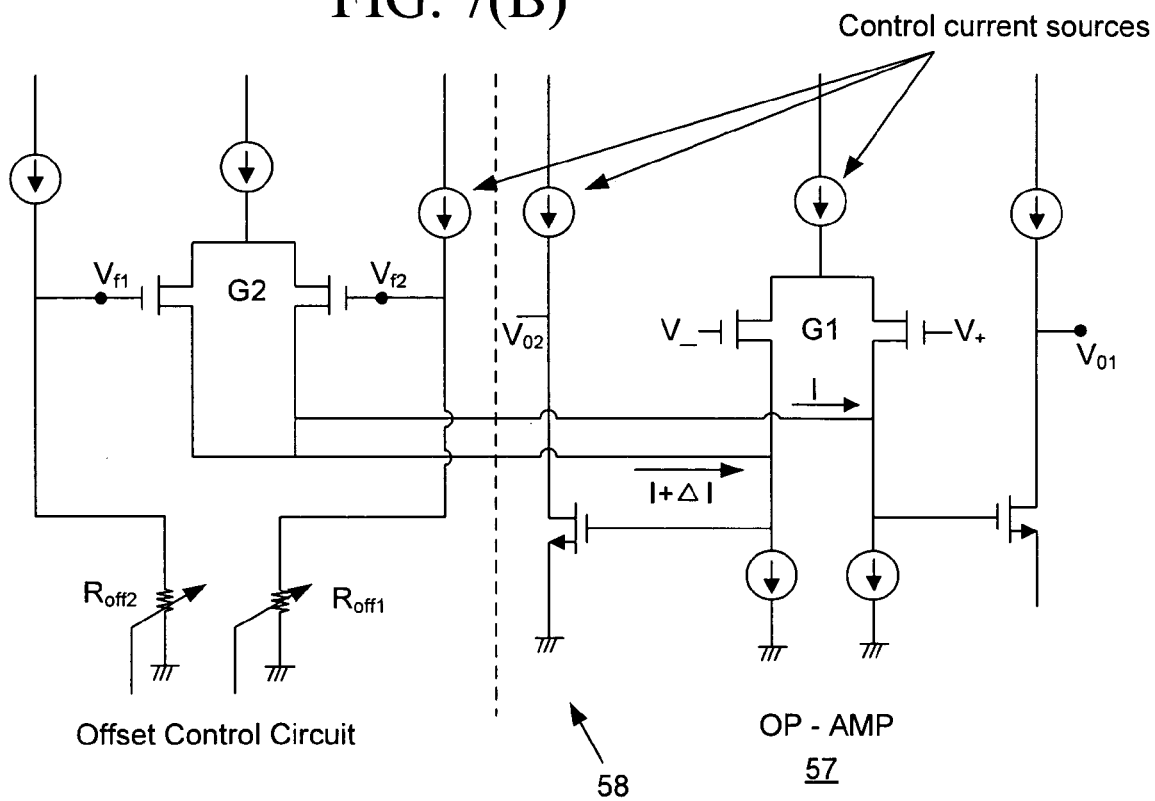

By varying the offset control resistors ($R_{off1}$ and $R_{off2}$) a small voltage difference ($V_{f1}$ and $V_{f2}$) is applied to the gates of the differential pair G2. This causes a small offset current to be added to the main differential pair G1 output currents. If this current is adjusted to be equal to the current produced in G1 by the offset voltage, then the offset of the main amplifier 57 is cancelled. The effect of this circuit 58 can be modeled as a voltage source that is placed in series with one of the virtual ground terminals of the amplifier 57 as shown in FIG. 7(B). Hence, if the voltage produced by this circuit 58 cancels the offset voltage of the amplifier 57, then the total input referred offset will be compensated. This results in a zero offset at the output of the VGA circuit 58 for all gain settings (any value of R1 and R2).

The offset produced by the offset cancellation circuit is approximately given by Equation (4): $V_{offset\_input} = (V_{f1} - V_{f2}) * (G1/G2)$. Here, $V_{f1}$ and $V_{f2}$ can be used as analog offset control terminals. In case of digital offset trimming, which is preferred in many applications, the voltage $V_{f1}$ and $V_{f2}$ is generated by passing a constant current ($I_b$) in two resistors $R_{off1}$ and $R_{off2}$. Hence, $V_{f1} = I_b * R_{off2}$ (Equation (5)) and $V_{f2} = I_b * R_{off1}$ (Equation (6)).

Figure 8A:
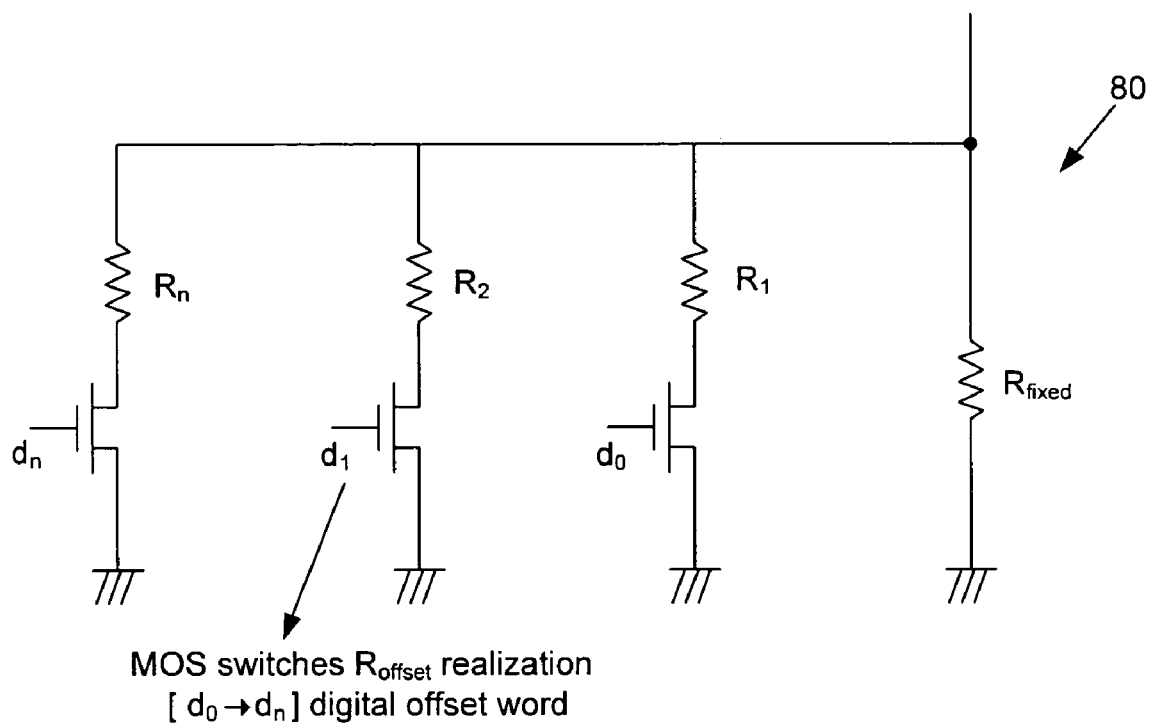
FIG. 8(A) is a schematic circuit diagram illustrating a digitally controlled resistor array according to an embodiment herein.
Figure 8B:
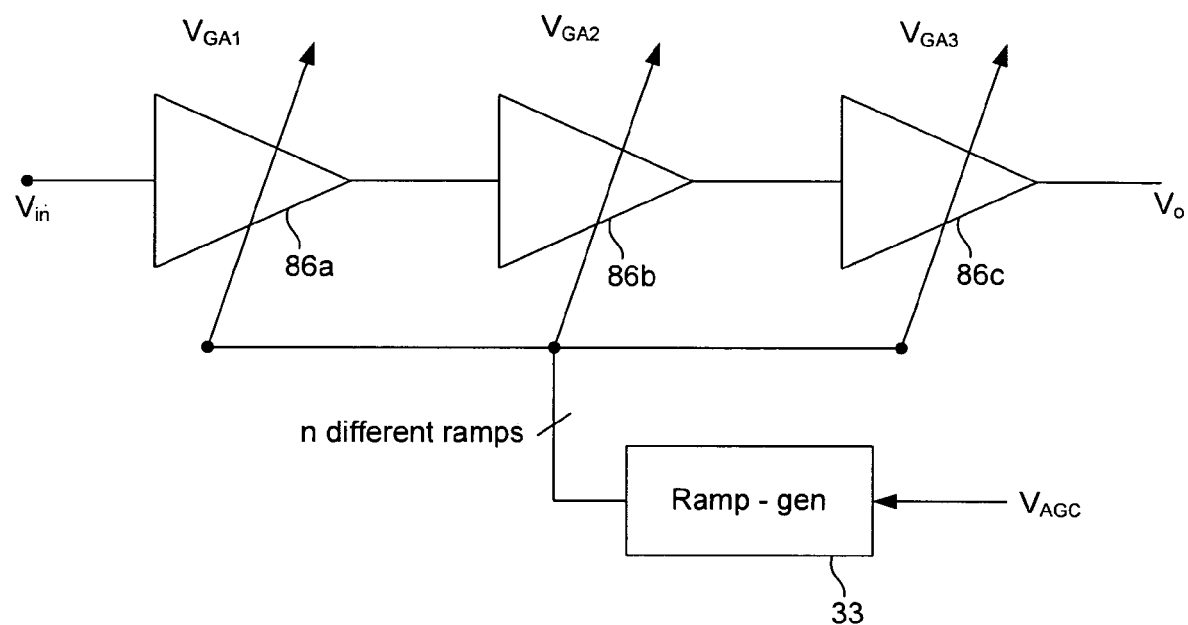
FIG. 8(B) is a schematic circuit diagram illustrating multiple VGA stages sharing the same ramp generator according to an embodiment herein.

A digitally controlled resistor array 80 is used to realize $R_{off1}$ and $R_{off2}$ as shown in FIG. 8(A). The digital offset word can thus be stored in a register. This enables the VGA offset to be calibrated at each powering up of the circuit 40, 45 (of FIGS. 4(A) and 4(B)) or at any regular calibration cycle. Additionally, the outputs of the VGA 40, 45 are buffered. Hence, the VGA circuit 40, 45 can drive circuits with resistive inputs. It also enables more than one VGA circuit to be directly cascaded to implement high gain control range. The ramp generator circuit 33 can also be shared among the cascaded amplifiers to save chip area and power consumption as indicated in FIG. 8(B), which shows multiple VGA stages (which can be "m-stages" in general) 86a, 86b, 86c sharing the same ramp signals from one ramp generator circuit 33. In other words, only one ramp generator circuit 33 is necessary for the three VGA stages 86a, 86b, 86c.

The embodiments herein can also be used to extend the useable bandwidth of the op-amp 31 used. This is significant if the VGA circuit 40, 45 is required to handle a high bandwidth signal over all the gain range. One limitation of op-amp based circuits known to those who are skilled in the art is that they provide a constant gain-bandwidth product. Hence, as the VGA circuit gain increases, the useable bandwidth of the op-amp decreases. Therefore, for a 25 dB gain control range, the op-amp will exhibit 25 dB of bandwidth loss. The bandwidth of any op-amp is usually determined by the size of the compensation capacitance used in the op-amp implementation. To make the op-amp bandwidth constant over the entire gain range, the value of the compensation cap is changed together with the gain setting of the VGA 40, 45. Thus, at higher gain settings, a smaller compensation capacitance is used while for lower gain settings a higher compensation capacitance is used. This maintains a wide and constant bandwidth of the VGA circuit 40, 45 for all gain settings. Furthermore, using the technique of dB-linear VGA realization provided by the embodiments herein, this can be accomplished with no additional area or power cost. It also helps improving the linearity of the VGA 40, 45 and does not degrade the noise performance.

Figure 8C:
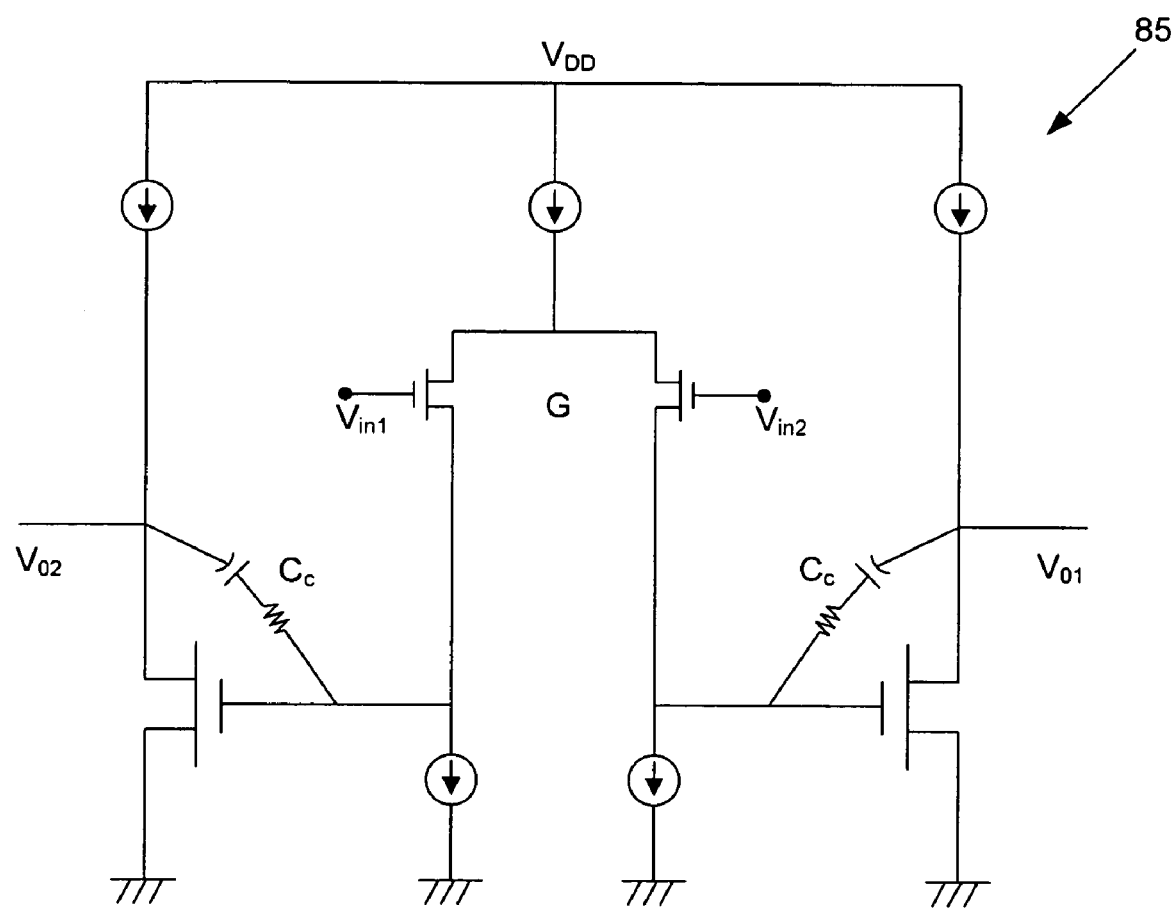
FIG. 8(C) is a schematic circuit diagram illustrating a conventional two stage op-amp circuit.
Figure 8D:
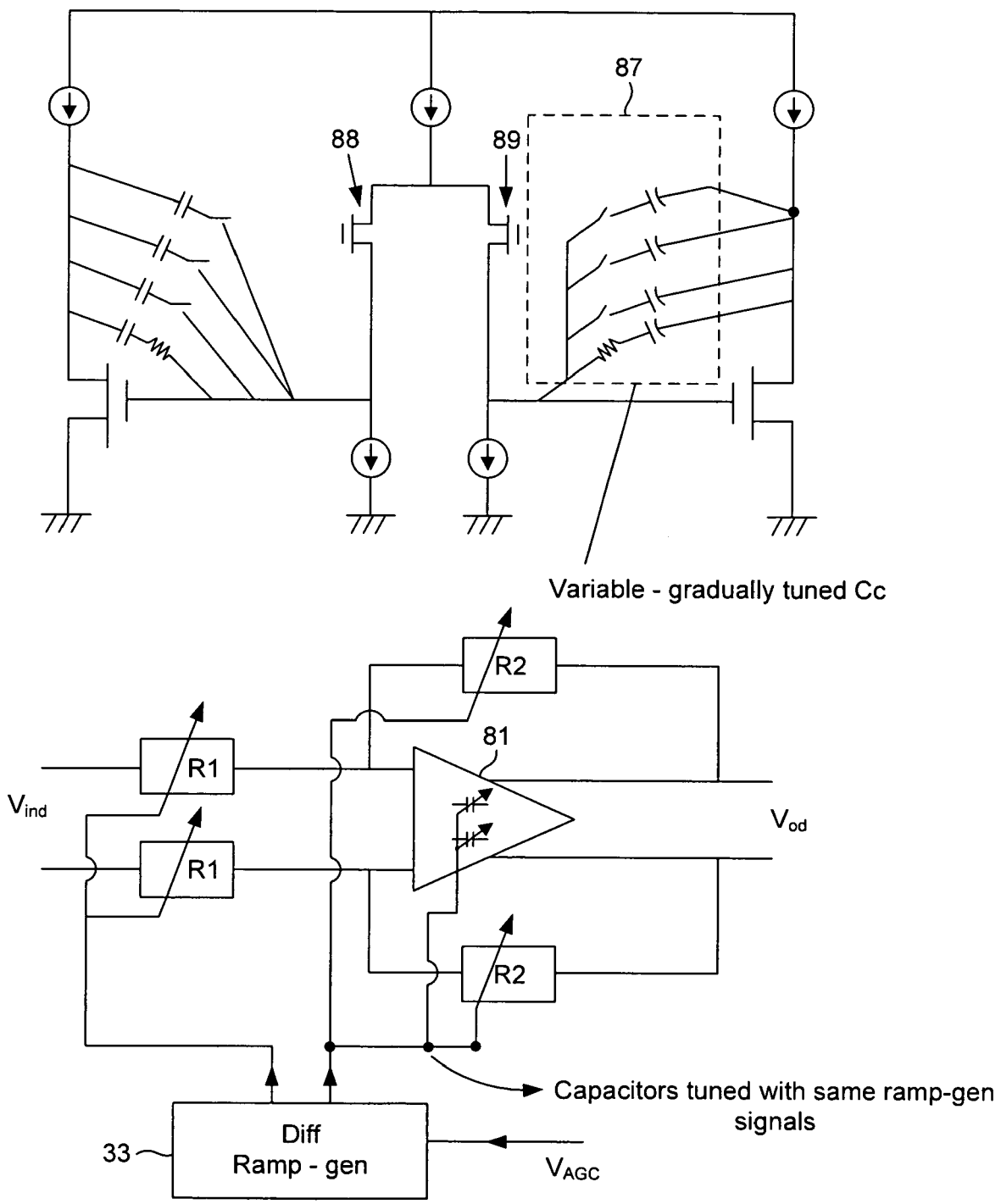
FIG. 8(D) is a schematic circuit diagram illustrating a two stage op-amp circuit according to an embodiment herein.

FIG. 8(C) shows a typical two stage op-amp circuit 85 with a compensation capacitance $C_c$. This capacitance sets the bandwidth (unity gain frequency, $f_u \sim G/C_c$) of the op-amp 85. To guarantee stability, the value of this capacitance has to be set to make the amplifier 85 stable across the entire range. Once this capacitance value is fixed, the op-amp 85 will exhibit a constant gain-bandwidth product. In other words, this capacitance, $C_c$, limits the bandwidth of the op-amp 85. Moreover, at different closed loop gain settings the bandwidth will drop as the gain is increased. If the compensation capacitance is replaced by a capacitance array 87 that is gradually switched using the MOS resistive switches ni (of FIGS. 4(A) and 4(B)) and the ramp-generator signals 33 of the VGA then the value of the compensation capacitance can be varied slowly with the gain. This is shown FIG. 8(D), which further shows input stage transistors 88, 89. Therefore, the control lines of the ramp-generator circuit 33 will thus gradually change the gain of the VGA (by changing resistances R1 and R2) and the total compensation capacitance of the op-amp 81 (by changing $C_c$) simultaneously. In one embodiment, an array of N compensation capacitors can be used. This optimizes the bandwidth of the VGA for all gain settings. However, smaller number of compensation capacitors can also be used (for example 2 to 3) if the application involved does not require the VGA to handle signals with high bandwidth.

Figure 9A:
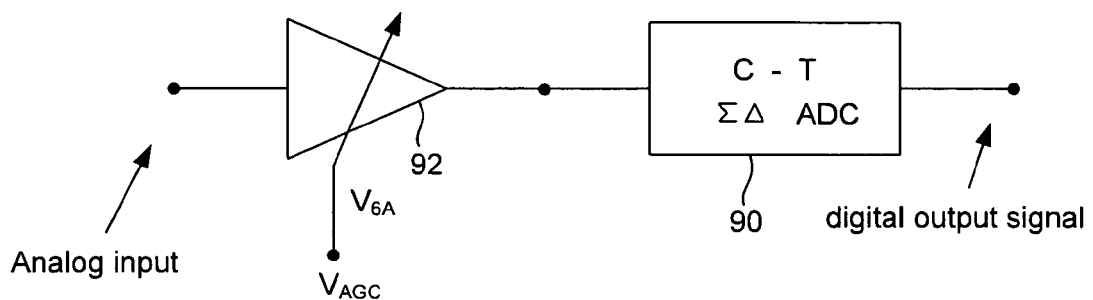
FIG. 9(A) is a block diagram illustrating a continuous time sigma delta modulator that is preceded by a VGA stage according to an embodiment herein.
Figure 9B:
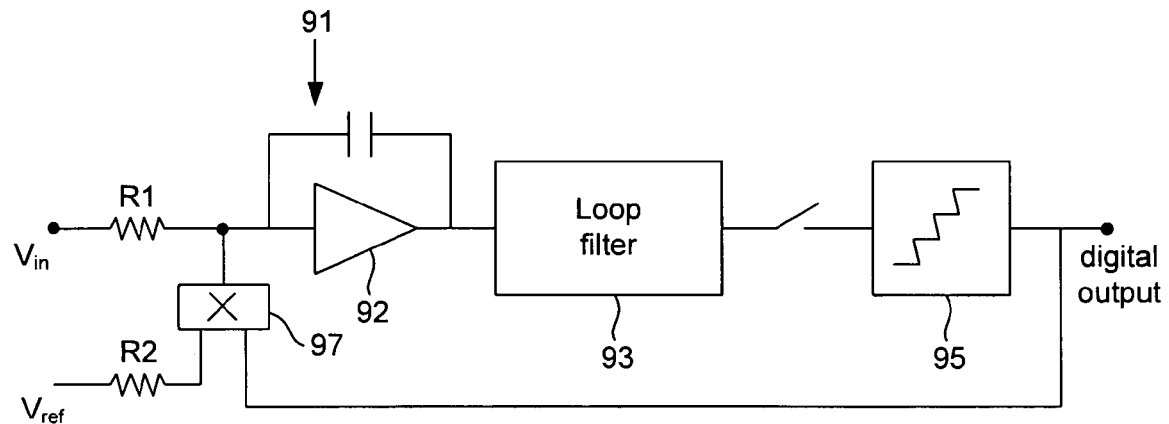
FIG. 9(B) is a block diagram illustrating a continuous time sigma delta ADC realization according to an embodiment herein.

The VGA technique provided by the embodiments herein can be effectively used in realizing VGA circuits that extend the dynamic range of continuous time sigma delta modulators without the use of any active blocks in the signal path. To illustrate this consider the block diagrams shown in FIGS. 9(A) and 9(B). More specifically, FIG. 9(A) shows a block diagram of a continuous time sigma delta modulator 90 that is preceded by a VGA stage 92. The VGA 92 regulates the signal amplitude at the input of the modulator 90. This reduces the required signal dynamic range handling capability of the sigma delta ADC (its dynamic range). However, the VGA circuit is in the signal path and will employ active elements to amplify the signal (such as op-amps, transistors, transconductances, etc.); hence, the total noise and distortion of the VGA active circuits should be better than the noise and distortion specifications of the data converter used. Furthermore, the use of active circuits in the realization of the VGA leads to more power consumption.

Accordingly, a solution that enables the VGA function to be integrated within the ADC without the use of any active device in the signal path is desirable. Such a solution is preferably power efficient. To implement a VGA function within the VGA circuit, consider FIG. 9(B), which illustrates a continuous time sigma delta ADC realization. The first stage of the ADC is an integrator 91 that is integrating the input signal and the feedback digital signal through resistors R1 and R2. The other blocks that are typically used in such an ADC are the loop filter 93 and quantizer/feedback DAC 95. Feedback switch 97 selects between $+V_{ref}$ and $-V_{ref}$ depending on the modulator output. Preferably, feedback switch 97 is a digital to analog converter. The overall gain of the ADC is given by the following (Equation (7)): $A=V_{ref}*(R1/R2)$. The resistance R1 converts the input voltage to a current $I_{in}=(V_{in}/R1)$. The feedback resistance R2 converts the reference voltage to a ref current $I_{ref}=(V_{ref}/R2)$. The ADC can process signals so long as $I_{in}<I_{ref}$. Thus, the value of R1 and R2 set a limit to the maximum signal the ADC can process. Similarly, the smallest signal the ADC can process is limited by the ADC noise. The noise of the ADC has two parts: thermal and quantization. If $I_{ref}$ is decreased, the quantization noise decreases, however the thermal noise will still be dominant and is mainly set by R1 and R2.

Figure 10:
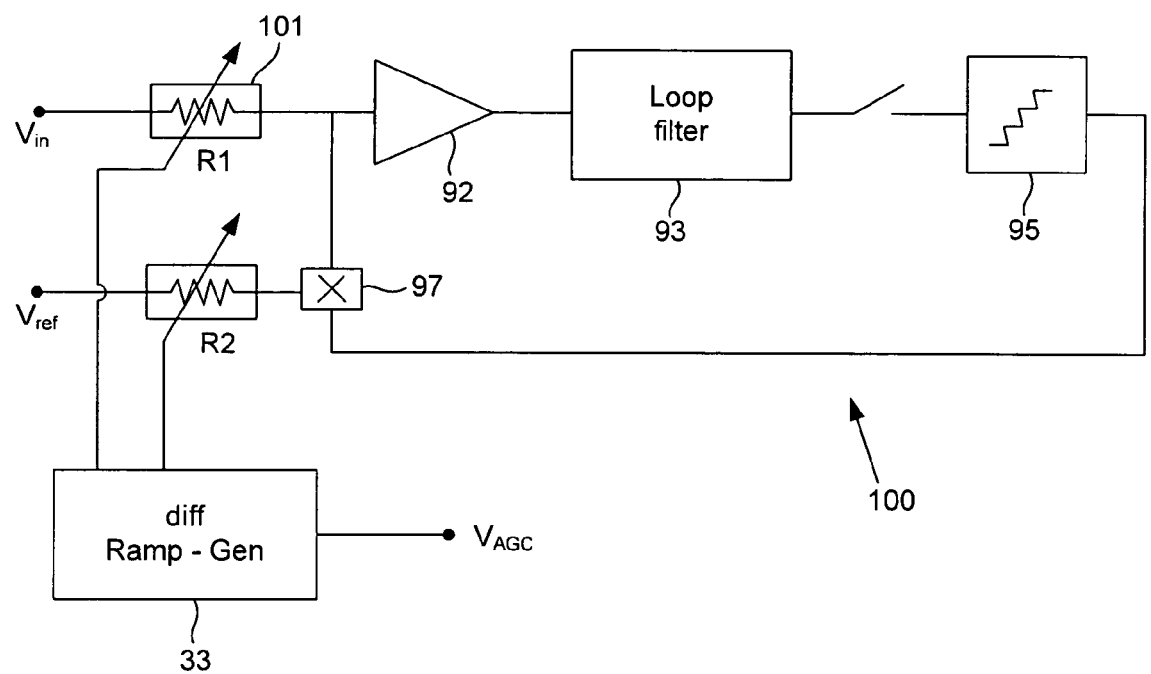
FIG. 10 is a block diagram illustrating an extended dynamic range of an ADC according to an embodiment herein.

Thus, to extend the dynamic range of the ADC (its maximum and minimum signal handling capability) R1 and R2 are simultaneously changed. This is depicted in the circuit 100 illustrated in FIG. 10. The resistance R1 and R2 are replaced by the resistive array 101, 102 with N control lines as discussed above. The control lines n1 of R1 and the control lines n2 of R2 are controlled by the differential ramp generator circuit 33 as discussed above. Hence, by controlling the control voltage, $V_{agc}$, the resistance R1 and R2 are simultaneously changed. As such, the overall gain of the ADC block changes in a dB-linear fashion with the AGC voltage. In FIG. 10 feedback switch 97 is preferably embodied as a simple 1 bit digital to analog converter.

It can also be shown that both the quantization noise and the thermal noise will be scaled using this method. To illustrate this, consider the case where the ADC is required to process a smaller signal $V_{in}$. For that case the resistance R1 will be lowered, hence the thermal noise contributed by R1 is reduced. Similarly, as R2 is increased, the thermal noise contribution from R2 as well as the $V_{ref}$ circuitry is also reduced. This results in an overall reduction of the thermal noise of the ADC converter. Increasing R2 also reduces the quantization noise of the ADC. Accordingly, for a smaller input signal, the overall noise level of the ADC is reduced and the data converter is able to resolve signals with a smaller amplitude.

Similarly, for signals with larger amplitude, the current $I_{in}$ is maintained to be smaller than $I_{ref}$ (otherwise the ADC will clip). This is achieved by increasing R1 and reducing R2, which simultaneously reduces $I_{in}$ and increases $I_{ref}$. Therefore, by using an AGC loop 93 to control the voltage $V_{agc}$, the dynamic range of the ADC tracks the signal and the ADC dynamic range is extended. This is similar to having a VGA stage 92 that precedes the ADC 90.

Some of the advantages afforded by technique provided by the embodiments herein in realizing an extended range ADC (with a VGA function) are (A) the overall dynamic range of the ADC is improved by the amount of gain provided in this stage (up to approximately 28 dB of increase); (B) no active components in the signal path. The only active circuitry used is the differential ramp generator 33. This circuit is a biasing circuit that is not in the signal path. Hence, it has negligible impact on linearity or noise performance. Also the power consumption of this circuit can be made small. (C) the VGA function is added with no impact on the ADC noise and negligible impact on the ADC linearity; (D) in systems that require the use of two matched ADCs (many wireless applications require this) the matching of the ADCs is not degraded by applying this technique. Also, the differential ramp-generator circuit 33 can be shared between the two ADCs hence saving chip area and power consumption.

FIG. 11, with reference to FIGS. 3 through 8(B) and 8(D) through 10, is a flow diagram illustrating a method for creating a dB-linear VGA 40, 45, 50 according to an embodiment herein, wherein the method comprises operatively connecting (201) a pair of resistor arrays 32, 34 to an operational amplifier 31, 52, wherein each resistor away 32, 34 comprises MOS transistor switches ni; operatively connecting (203) a differential ramp-generator circuit 33 to the pair of resistor arrays 32, 34; and the differential ramp-generator circuit 33 comprising voltage control lines that apply (205) voltage to a gate of each of the MOS transistor switches ni in the pair of resistor arrays 32, 34.

Preferably, the number of the voltage control lines that are used to apply voltage to the gate of each of the MOS transistor switches ni is equal to the number of resistors N in a particular resistor array 32, 34. The method may further comprise the differential ramp-generator circuit 33 taking an automatic gain control voltage, generating a series of differential ramp voltages, and applying the series of differential ramp voltages to one of the MOS transistor switches ni.

The conductance on a first of the pair of resistor arrays 34 may linearly and continuously increases while simultaneously the conductance on a second of the pair of resistor arrays 32 linearly and continuously decreases as the automatic gain control voltage increases. Moreover, the method may further comprise operatively connecting a voltage source device 56 in series with a virtual ground terminal of the operational amplifier 52. Furthermore, the operational amplifier 31, 52 preferably comprises a capacitance array 87 operable to be gradually switched using the MOS transistor switches ni and ramp-generator signals generated by the differential ramp-generator circuit 33. Additionally, the method may further comprise using an automatic gain control loop filter 93 to control the automatic gain control voltage. Also, the method may further comprise the differential ramp-generator circuit 33 taking an automatic gain control voltage, generating a series of differential ramp voltages, and applying the series of differential ramp voltages to multiple operational amplifiers 86a, 86b, 86c.

The techniques provided by the embodiments herein may be implemented in an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
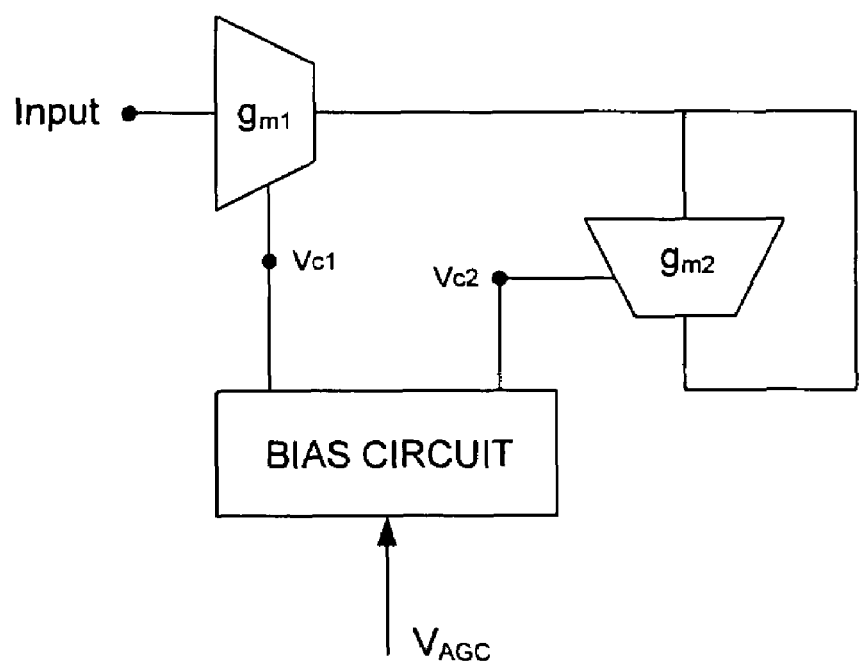

Generally, the embodiments herein provide a technique that enables the implementation of dB-linear variable gain amplifiers with rail-to-rail input and output swings, low noise, and high linearity. This is demonstrated by a VGA circuit 40, 45 that is implemented using this technique. The implemented circuit 40, 45 achieves (1) rail-to-rail fully differential signal swings (at both input and output terminals); (2) DC-offset cancellation scheme that is independent of the VGA gain setting; hence, offset calibration can be performed once at any gain setting; (3) low noise and high linearity that results in a wide dynamic range, wherein the circuitry used to implement this technique has a negligible effect on degrading noise and linearity; and (4) the VGA realized with such techniques can be made tolerant to device non-idealities, process variations, and device mismatches. This is especially important in wireless applications because many wireless architectures require two identical VGA circuits to be used in the I and Q paths of the receive chain. This is shown in FIG. 2. Good matching between the VGA circuits is required to achieve acceptable overall Bit error rate (BER) performance. (5) The technique provided by the embodiments herein and the circuits involved in its implementation can be also used to enable the op-amps 31 employed to exhibit a constant unity gain frequency for all VGA gain settings. This results in an improved bandwidth of the VGA circuits for all VGA gain settings. This can be performed with no additional power penalty and leads to no noise or linearity degradation. (6) The embodiments herein also allow for a buffered output voltage that can drive low impedance circuits.

The versatility of the technique provided by the embodiments herein is also demonstrated by implementing a linear dB-VGA function within an over sampled sigma-delta data converter and has several advantages including: the dB-linear VGA function is integrated within the ADC circuitry without the need of any additional active components; the dynamic range of the ADC is extended by the VGA gain control range (hence the ADC is able to resolve signals better); and the added circuitry in the signal path has a negligible effect on noise and linearity of the ADC.

The technique provided by the embodiments herein can be applied to all circuits that have a gain that is a function of the ratio of two resistors (or transconductances). Therefore, the technique provided by the embodiments herein can apply to the design of radio frequency (RF)-VGA circuits as well. It can also be implemented in technologies other than complementary metal oxide semiconductors (CMOS) such as BICMOS, silicon germanium (SiGe), bipolar, and gallium arsenide (GaAs), for example. Furthermore, the embodiments herein may be used in the design/implementation of any receiver/transmitter (for example, wireless, TV tuner, cell phone, satellite tuner, etc.) and can also be used in disk-drives, hearing aids, modems, wire line applications or in any application requiring the use of an AGC loop.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method for creating a dB-linear variable gain amplifier (VGA), said method comprising:

operatively connecting a pair of resistor arrays to an operational amplifier, wherein each resistor array comprises metal oxide semiconductor (MOS) transistor switches;

operatively connecting a differential ramp-generator circuit to said pair of resistor arrays; and said differential ramp-generator circuit comprising voltage control lines that apply voltage to a gate of each of said MOS transistor switches in said pair of resistor arrays.

2. The method of claim 1, wherein the number of said voltage control lines that are used to apply voltage to said gate of each of said MOS transistor switches is equal to the number of resistors in a particular resistor array.

3. The method of claim 1, further comprising said differential ramp-generator circuit taking an automatic gain control voltage, generating a series of differential ramp voltages, and applying said series of differential ramp voltages to one of said MOS transistor switches.

4. The method of claim 3, wherein the conductance on a first of said pair of resistor arrays linearly and continuously increases while simultaneously the conductance on a second of said pair of resistor arrays linearly and continuously decreases as said automatic gain control voltage increases.

5. The method of claim 1, further comprising operatively connecting a voltage source device in series with a virtual ground terminal of said operational amplifier.

6. The method of claim 1, wherein said operational amplifier comprises a capacitance array operable to be gradually switched using said MOS transistor switches and ramp-generator signals generated by said differential ramp-generator circuit.

7. The method of claim 3, further comprising operatively connecting an automatic gain control loop filter to differential ramp-generator circuit.

8. The method of claim 1, further comprising said differential ramp-generator circuit taking an automatic gain control voltage, generating a series of differential ramp voltages, and applying said series of differential ramp voltages to multiple operational amplifiers.

9. A variable gain amplifier (VGA) comprising:
an amplifier;
a pair of resistor arrays operatively connected to said amplifier, wherein each resistor array comprises metal oxide semiconductor (MOS) transistor resistive switches;
a differential ramp-generator circuit operatively connected to said pair of resistor arrays; and
voltage control lines generated by said differential ramp-generator circuit, wherein said voltage control lines are operatively connected to each of said MOS transistor resistive switches in said pair of resistor arrays.

10. The VGA of claim 9, wherein the number of said voltage control lines that are operatively connected to said each of said MOS transistor resistive switches is equal to the number of resistors in a particular resistor array.

11. The VGA of claim 9, wherein said differential ramp-generator circuit is operable to take an automatic gain control voltage and generate a series of differential ramp voltages and apply said series of differential ramp voltages to one of said MOS transistor resistive switches.

12. The VGA of claim 11, wherein the conductance on a first of said pair of resistor arrays linearly and continuously increases while simultaneously the conductance on a second of said pair of resistor arrays linearly and continuously decreases as said automatic gain control voltage increases.

13. The VGA of claim 9, further comprising a voltage source device operatively connected in series with a virtual ground terminal of said amplifier.

14. The VGA of claim 9, wherein said amplifier comprises a capacitance away operable to be gradually switched using said MOS transistor resistive switches and ramp-generator signals generated by said differential ramp-generator circuit.

15. The VGA of claim 11, further comprising an automatic gain control loop filter operatively connected to said differential ramp-generator circuit.

16. The VGA of claim 9, wherein said differential ramp-generator circuit is operable to take an automatic gain control voltage and generate a series of differential ramp voltages and apply said series of differential ramp voltages to multiple operational amplifiers.

17. A system comprising:
an operational amplifier;
at least one set of resistor arrays operatively connected to said operational amplifier, wherein each resistor array comprises metal oxide semiconductor (MOS) transistor switches; and
a differential ramp-generator circuit operatively connected to said at least one set of resistor arrays, wherein said differential ramp-generator circuit is operable to generate voltage control lines that apply voltage to a gate of each of said MOS transistor switches in said at least one set of resistor arrays.

18. The system of claim 17, wherein the number of said voltage control lines that are used to apply voltage to said gate of each of said MOS transistor switches is equal to the number of resistors in a particular resistor array.

19. The system of claim 17, wherein said differential ramp-generator circuit is operable to take an automatic gain control voltage and generate a series of differential ramp voltages and apply said series of differential ramp voltages to one of said MOS transistor switches.

20. The system of claim 19, wherein the conductance on a first of said at least one set of resistor arrays linearly and continuously increases while simultaneously the conductance on a second of said at least one set of resistor arrays linearly and continuously decreases as said automatic gain control voltage increases.

21. The system of claim 17, further comprising a voltage source device operatively connected in series with a virtual ground terminal of said operational amplifier.

22. The system of claim 17, wherein said operational amplifier comprises a capacitance array operable to be gradually switched using said MOS transistor switches and ramp-generator signals generated by said differential ramp-generator circuit.

23. The system of claim 19, further comprising an automatic gain control loop filter operatively connected to said differential ramp-generator circuit.

24. The system of claim 17, wherein said differential ramp-generator circuit is operable to take an automatic gain control voltage and generate a series of differential ramp voltages and apply said series of differential ramp voltages to multiple operational amplifiers.

* * * * *